United States Patent
Do et al.

(10) Patent No.: US 8,815,673 B2
(45) Date of Patent: Aug. 26, 2014

(54) METHODS OF FORMING MOSFET DEVICES USING NITROGEN-INJECTED OXIDE LAYERS TO FORM GATE INSULATING LAYERS HAVING DIFFERENT THICKNESSES

(75) Inventors: Jin-ho Do, Yongin-si (KR); Moon-han Park, Yongin-si (KR); Weon-hong Kim, Suwon-si (KR); Kyung-il Hong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/480,947

(22) Filed: May 25, 2012

(65) Prior Publication Data

US 2012/0309144 A1    Dec. 6, 2012

(30) Foreign Application Priority Data

Jun. 1, 2011    (KR) .......................... 10-2011-0052994

(51) Int. Cl.
*H01L 21/8238*    (2006.01)
*H01L 21/28*    (2006.01)
*H01L 29/51*    (2006.01)

(52) U.S. Cl.
CPC ... *H01L 21/823857* (2013.01); *H01L 21/28202* (2013.01); *H01L 29/518* (2013.01)
USPC ............................ 438/199; 438/287; 438/591

(58) Field of Classification Search
CPC .............................................. H01L 21/28211
USPC ......... 438/149, 151, 197, 199, 216, 283, 287, 438/591, FOR. 177; 257/E21.625, E21.639, 257/406

See application file for complete search history.

(56) References Cited

U.S. PATENT DOCUMENTS

| | | | |
|---|---|---|---|
| 6,087,236 A * | 7/2000 | Chau et al. ................... | 438/301 |
| 6,168,980 B1 * | 1/2001 | Yamazaki et al. ............ | 438/162 |
| 6,417,038 B1 * | 7/2002 | Noda ............................ | 438/224 |
| 6,613,658 B2 * | 9/2003 | Koyama et al. ............... | 438/591 |
| 7,078,354 B2 * | 7/2006 | Kanda .......................... | 438/770 |
| 2002/0014625 A1 * | 2/2002 | Asami et al. .................... | 257/57 |
| 2004/0087159 A1 * | 5/2004 | Kim et al. ..................... | 438/690 |

FOREIGN PATENT DOCUMENTS

| | | |
|---|---|---|
| JP | 2000-353670 | 12/2000 |
| JP | 2002-009169 | 1/2002 |
| JP | 2006-313769 | 11/2006 |

* cited by examiner

*Primary Examiner* — Colleen Matthews
*Assistant Examiner* — Quovaunda V Jefferson
(74) *Attorney, Agent, or Firm* — Myers Bigel Sibley & Sajovec, P.A.

(57) ABSTRACT

In some embodiments of the inventive subject matter, methods include forming an oxide layer on a semiconductor substrate, injecting nitrogen into the oxide layer to form a nitrogen injection layer and to change the oxide layer to an oxynitride layer, removing a part of the oxynitride layer to leave a portion of the oxynitride layer in a first area and expose the nitrogen injection layer in a second area and forming an insulating layer comprising a portion on the portion of the oxynitride layer in the first area and a portion on the nitrogen injection layer in the second area. The insulating layer may have a higher dielectric constant than the oxide layer.

13 Claims, 13 Drawing Sheets

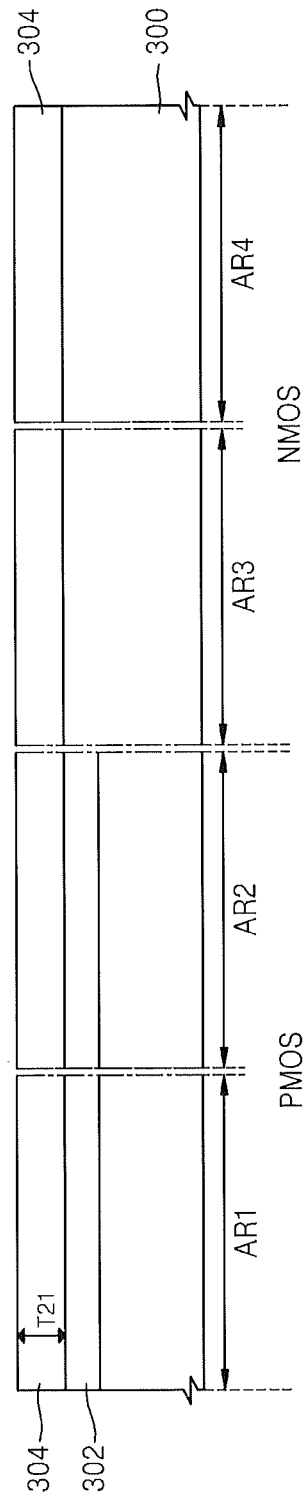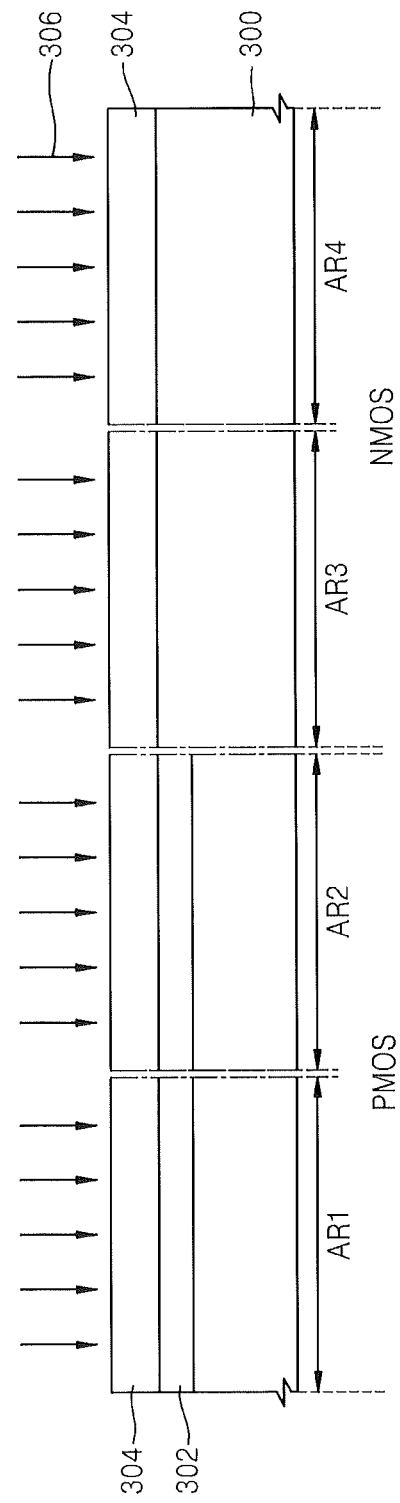

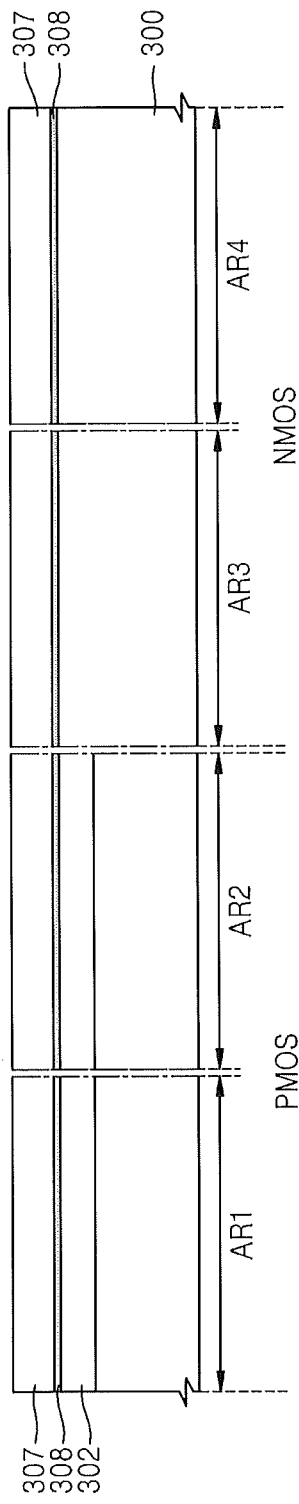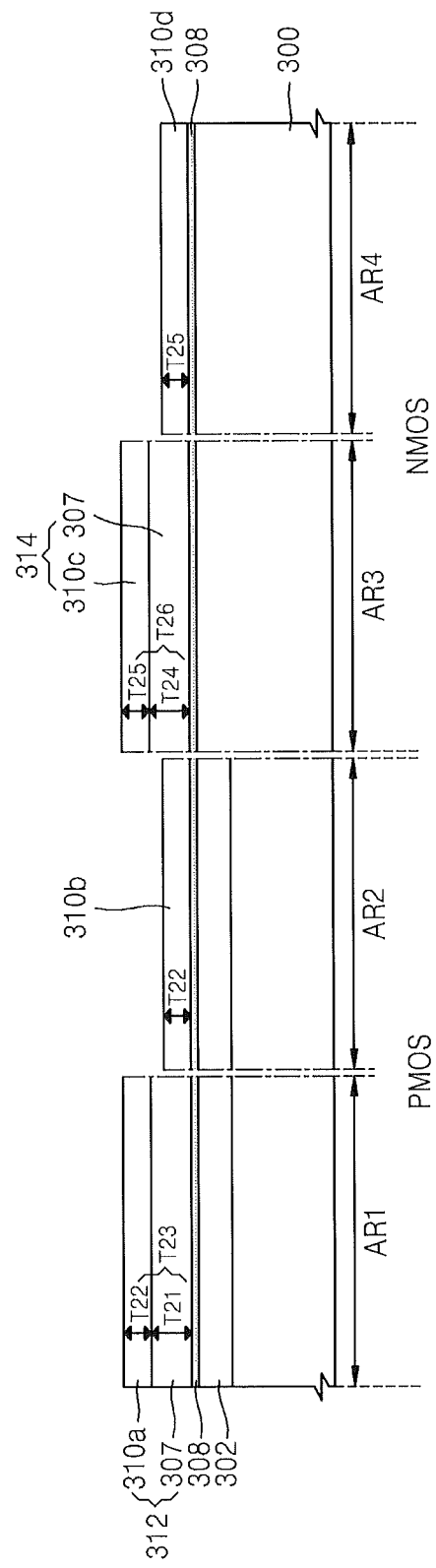

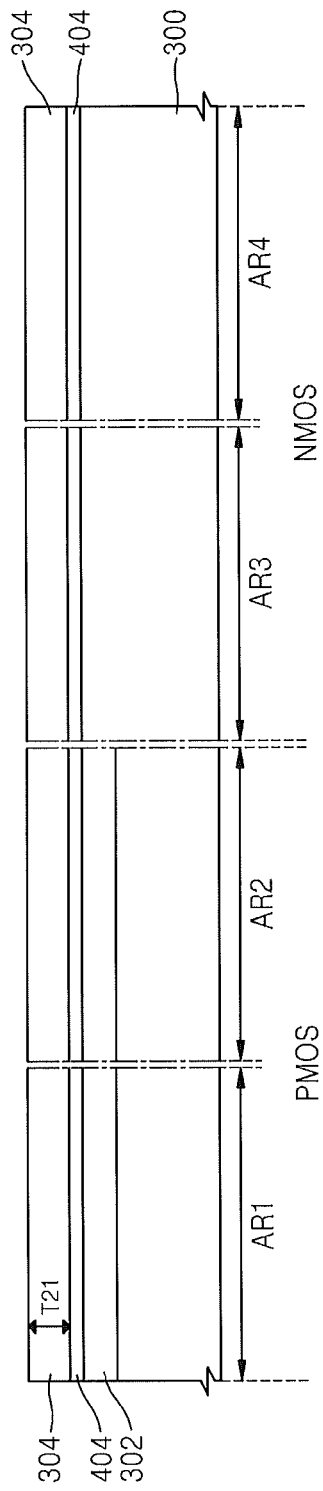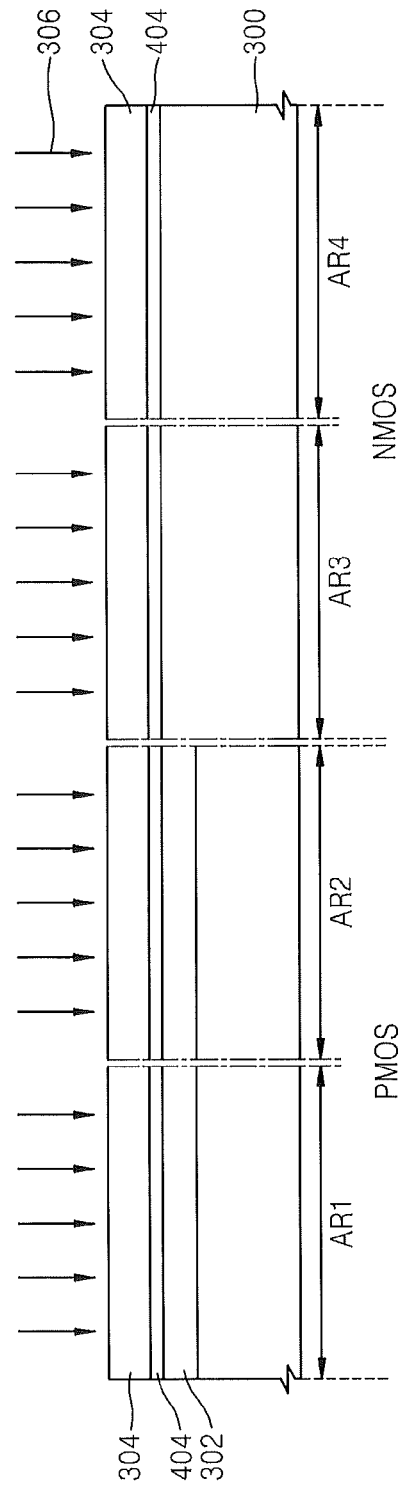

METHODS OF FORMING MOSFET DEVICES USING NITROGEN-INJECTED OXIDE LAYERS TO FORM GATE INSULATING LAYERS HAVING DIFFERENT THICKNESSES

CROSS-REFERENCE TO RELATED APPLICATIONS

This application claims the benefit of Korean Patent Application No. 10-2011-0052994, filed on Jun. 1, 2011, in the Korean Intellectual Property Office, the disclosure of which is incorporated herein in its entirety by reference.

BACKGROUND

The inventive subject matter generally relates to methods of fabricating metal oxide semiconductor field effect transistors (MOSFETs) and, more particularly, to methods of fabricating MOSFETs including gate insulating layers with different thicknesses.

Semiconductor integrated circuit devices commonly include both low voltage metal oxide semiconductor field effect transistor (MOSFET) devices and high voltage MOSFET devices. These devices commonly use gate insulating layers having different thicknesses. However, with the increased integration of semiconductor integrated circuit devices, it may be difficult to produce low and high voltage MOSFET devices with gate insulating layers having different thicknesses.

SUMMARY

In some embodiments of the inventive subject matter, methods include forming an oxide layer on a semiconductor substrate and injecting nitrogen into the oxide layer to form a nitrogen injection layer and to change the oxide layer to an oxynitride layer. The methods further include removing a part of the oxynitride layer to leave a portion of the oxynitride layer in a first area and expose the nitrogen injection layer in a second area and forming an insulating layer including a portion on the portion of the oxynitride layer in the first area and a portion on the nitrogen injection layer in the second area. The insulating layer may have a higher dielectric constant than the oxide layer.

In some embodiments, forming an oxide layer on a semiconductor substrate may be preceded by forming a channel epitaxial layer on the semiconductor substrate. The nitrogen injection layer may be formed on the channel epitaxial layer. The channel epitaxial layer may include silicon-germanium (SiGe).

In further embodiments, forming a channel epitaxial layer on the semiconductor substrate may be followed by forming a silicon cap layer on the channel epitaxial layer. The nitrogen injection layer may be formed on the silicon cap layer.

In some embodiments, injecting nitrogen into the oxide layer to form a nitrogen injection layer and to change the oxide layer to an oxynitride layer may be followed by thermally treating the semiconductor substrate. In further embodiments, forming an insulating layer may be followed by thermally treating the semiconductor substrate.

The methods may further include forming a first gate electrode on a first gate insulating layer including the insulating layer and the portion of the oxynitride layer in the first area and a second gate electrode on a second gate insulating layer including the insulating layer in the second area, such that the first and second gate insulating layers have different thicknesses. Source and drain regions may be formed in the substrate adjacent the gate electrodes.

Further embodiments provide methods including forming first and second P-type regions and first and second N-type regions in a semiconductor substrate and forming channel epitaxial layers on the first and second N-type regions. An oxide layer is formed on the first and second P-type regions and on the channel epitaxial regions and nitrogen is injected into the oxide layer to form a nitrogen injection layer on the first and second P-type regions and the channel epitaxial layers and to convert the oxide layer to an oxynitride layer. The methods further include removing portions of the oxynitride layer to expose the nitrogen injection layer on the second P-type region and the second N-type region and leave portions of the oxynitride layer on the first P-type region and the first N-type region. An insulating layer is formed on the portions of the oxynitride layer on the first N-type region and the first P-type region and on the exposed nitrogen injection layer on the second N-type region and the second P-type region.

In some embodiments, injecting nitrogen into the oxide layer to form a nitrogen injection layer on the first and second P-type regions and the first and channel epitaxial layers and to convert the oxide layer to an oxynitride layer may include treating the oxide layer using a nitrogen plasma or thermally treating the oxide layer in a nitrogen atmosphere. Forming channel epitaxial layers on the first and second N-type regions may be followed by forming silicon cap layers on the channel epitaxial layers. The nitrogen injection layer may be formed on the silicon cap layers.

The methods may further include forming respective first, second, third and fourth gate electrodes on respective ones of the first and second N-type regions and the first and second P-type regions. Source and drain regions may also be formed in the substrate adjacent the first, second, third and fourth gate electrodes.

Additional embodiments provide methods of forming transistors including forming an oxide layer on first and second semiconductor regions and converting the oxide layer to an oxynitride layer. The methods further include removing a part of the oxynitride layer on the first semiconductor region while leaving a portion of the oxynitride layer remaining on the second semiconductor region, forming an insulating layer on the remaining portion of the oxynitride layer and on the second semiconductor region, forming respective first and second gate electrodes on the insulating layer on respective ones of the first and second semiconductor regions and forming source and drain regions adjacent the first and second gate electrodes. Converting the oxide layer to an oxynitride layer may include injecting nitrogen into the oxide layer. The first gate electrode may be part of a first transistor having a first gate insulator with a first thickness and the second gate electrode may be part of a second transistor having a second gate insulator with a second thickness greater than the first thickness.

BRIEF DESCRIPTION OF THE DRAWINGS

Exemplary embodiments of the inventive subject matter will be more clearly understood from the following detailed description taken in conjunction with the accompanying drawings in which:

FIGS. 9 through 12 are cross-sectional views illustrating operations for forming a MOSFET device according to some embodiments of the inventive subject matter;

FIGS. 13 through 16 are cross-sectional views illustrating operations for forming a MOSFET device according to some embodiments of the inventive subject matter;

DETAILED DESCRIPTION OF THE EMBODIMENTS

Figure 1:
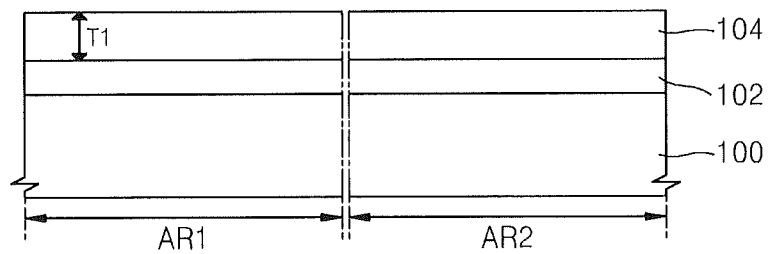
FIGS. 1 through 4 are cross-sectional views illustrating operations for forming a metal oxide semiconductor field effect transistor (MOSFET) device according to some embodiments of the inventive subject matter.

The inventive subject matter will now be described more fully with reference to the accompanying drawings, in which exemplary embodiments of the inventive subject matter are shown. The inventive subject matter may, however, be embodied in many different forms and should not be construed as being limited to the embodiments set forth herein; rather, these embodiments are provided so that this disclosure will be thorough and complete, and will fully convey the inventive subject matter. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

A MOSFET device refers to a metal oxide semiconductor (MOS) field effect transistor (FET) device. The MOSFET device is also referred to as a MOS device. A FET device is well known in the electronic technology field. Standard components of the FET device include a source, a drain, and a body and a gate formed between the source and the drain. The gate covers the body, and a conducting channel is induced to the body formed between the source and the drain. The gate is isolated from the body through a gate insulating layer or a gate dielectric layer. The FET device is classified into two types, i.e., an NFET device and a PFET device, depending on whether an on-state current is transmitted from the conducting channel through electrons or holes. The NFET and PFET devices are also referred to as NMOS and PMOS devices, respectively. The NFET and PFET devices are frequently understood as being used together in circuits. If a circuit includes both the NFET and PFET devices, the circuit is referred to as a CMOS. Circuits formed of combinations of NFETs and PFETS have various applications in analog or digital circuits.

Processes of forming an NFET, a PFET, and a CMOS will be understood as having infinite modifications. In embodiments of the inventive subject matter, any of a range of process technologies known to form the devices may be used, and processes related to the embodiments will be mainly described in detail.

When the MOSFET device is applied to an integrated circuit semiconductor device, a low voltage MOSFET device that operates at a low voltage and a high voltage MOSFET device that operates at a high voltage may be simultaneously realized. Therefore, gate insulating layers having different thicknesses are to be formed on a semiconductor substrate. When the gate insulating layers having the different thicknesses are formed on the semiconductor substrate, the gate insulating layers should not have a harmful effect on each other. Also, PMOS and NMOS devices should not have a harmful effect on each other.

FIGS. 1 through 4 are cross-sectional views illustrating operations for forming a MOSFET device according to some embodiments of the inventive subject matter.

In more detail, FIGS. 1 through 4 are cross-sectional views illustrating operations for forming a MOSFET device including gate insulating layers having different thicknesses. Referring to FIG. 1, a semiconductor substrate 100 including first and second areas AR1 and AR2 is provided. The semiconductor substrate 100 may be an N type or P type silicon wafer or a silicon substrate.

A channel epitaxial layer 102 may be formed on the semiconductor substrate 100. The channel epitaxial layer 102 may be formed of silicon-germanium (SiGe). In FIGS. 1 through 4, the channel epitaxial layer 102 is formed in both the first and second areas AR1 and AR2 or may be formed in one area if necessary. In other words, the channel epitaxial layer 102 may be formed in only one of the first and second areas AR1 and AR2. For example, if the channel epitaxial layer 102 is not formed in the first area AR1 but is formed in the second area AR2, the first area AR1 may be an NMOS region, and the second area AR2 may be the PMOS region.

An oxide layer 104 having a first thickness T1 is formed above the semiconductor substrate 100 having the first and second areas AR1 and AR2. The first thickness T1 may be within a range between about 40 nm and about 80 nm. If the channel epitaxial layer 102 is formed, the oxide layer 104 is formed on the channel epitaxial layer 102.

Figure 2:
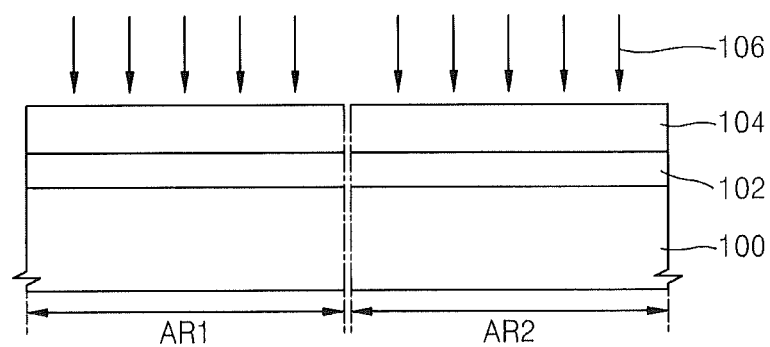

Referring to FIG. 2, the oxide layer 104 having the first thickness T1 is nitrified. Nitrogen 106 is injected into the oxide layer 104 as shown in FIG. 2 to nitrify the oxide layer 104. Since parts of the oxide layer 104 in the first and second areas AR1 and AR2 have the same thicknesses, i.e., the first thicknesses T1, the nitrogen 106 is substantially uniformly injected into the first and second areas AR1 and AR2. Nitrifying may be performed, for example, through nitrogen plasma treatment or thermal treatment in a nitrogen atmosphere.

Figure 3:
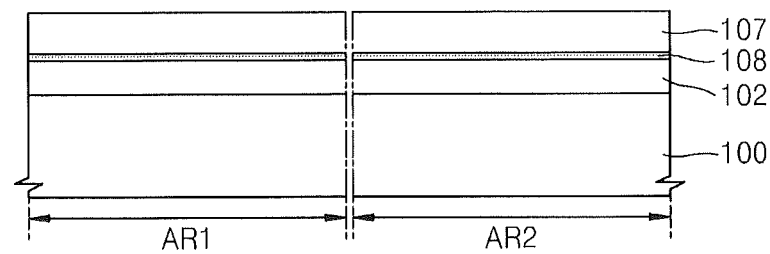

Referring to FIG. 3, if nitrifying as described above is performed, a nitrogen injection layer 108 having a substantially uniform density is formed above the semiconductor substrate 100 in the first and second areas AR1 and AR2, and the oxide layer 104 is changed to an oxynitride layer 107. Since the nitrogen injection layer 108 is formed to the uniform density in the first and second areas AR1 and AR2 of the semiconductor substrate 100, the oxynitride layer 107 may be formed to a desired thickness.

If the channel epitaxial layer 102 is formed, the nitrogen injection layer 108 is formed on the channel epitaxial layer 102. The nitrogen injection layer 108 may be formed at an interface between the oxynitride layer 107 and the channel epitaxial layer 102 or at an interface between the oxynitride layer 107 and the semiconductor substrate 100.

After the oxide layer 104 is changed to the oxynitride layer 107, the semiconductor substrate 100 may be thermally treated. If the semiconductor substrate 100 is thermally treated, the nitrogen injection layer 108 and the oxynitride layer 107 may be more and more activated and densified. The thermal treatment may be performed, for example, by heating for about 1 hour in a furnace at a temperature between 400° C. and 800° C.

Figure 4:
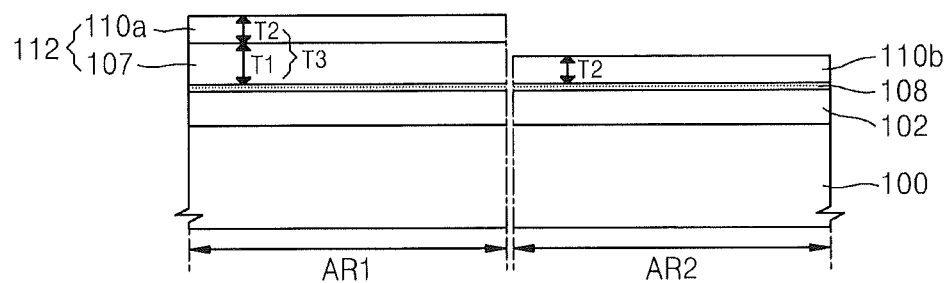

Referring to FIG. 4, a part of the oxynitride layer 107 in the second area AR2 is removed. Respective insulating layers 110a and 110b having a second thickness T2 are formed on the oxynitride layer 107 in the first area AR1 and on the nitrogen injection layer 108 in the second area AR2. The second thickness T2 may be 20 nm or less, e.g., may be within a range between about 5 nm and about 20 nm. When the insulating layer 110b in the second area AR2 is formed, the insulating layer 110b may be formed to a desired thickness due to the nitrogen injection layer 108 having a substantially uniform density. When the insulating layer 110b in the second area AR2 is formed, the channel epitaxial layer 102 may not be damaged due to the nitrogen injection layer 108, and the insulating layers 110a and 110b in the first and second areas AR1 and AR2 may have substantially the same thickness.

The insulating layers 110a and 110b may have higher dielectric constants than an oxide layer. The dielectric layers may include, for example, HfO2, ZrO2, TiO2, Al2O3, Ta2O3, Nb2O3, Pr2O3, Ce2O3, Dy2O3, Er2O3, Y2O3, ZrSiO4, ZrSiON, HfSiO, HfSiON, HfAlON, AlSiON, BaSiO4, PbSiO4, BaSrTiO3 (BST), and/or Pb(ZrxTi1-x)O3) (PZT). After the insulating layers 110a and 110b are formed, the semiconductor substrate 100 above which the insulating layers 110a and 110b have been formed may be thermally treated as described above. Thermal treatment may be performed both after the oxynitride layer 107 is formed and after the insulating layers 110a and 110b.

Therefore, a first gate insulating layer 112 having a third thickness T3 is formed of the oxynitride layer 107 having the first thickness T1 and the insulating layer 110a having the second thickness T2 in the first area AR1. A second gate insulating layer 110b is formed of the insulating layer 110b having the second thickness T2 in the second area AR2. In FIG. 4, for convenience, the thickness of the oxynitride layer 107 is denoted by reference character T1, but a total thickness of the nitrogen injection layer 108 and the oxynitride layer 107 may also be denoted by reference character T1.

The thicknesses of the first and second gate insulating layers 112 and 110b in the first and second areas AR1 and AR2 are thus different. The first gate insulating layer 112 includes the oxynitride layer 107 and the insulating layer 110a in the first area AR1, and the second gate insulating layer 110b includes the insulating layer 110b in the second area AR2.

Therefore, the first and second gate insulating layers 112 and 110b in the first and second areas AR1 and AR2 may be formed of different materials to different thicknesses. The gate insulating layers may be adjusted through an adjustment of the thicknesses of the oxynitride layer 107 and the insulating layers 110a and 110b or a change of materials of the insulating layers 110a and 110b in the first and second areas AR1 and AR2. As a result, a device parameter, e.g., a threshold voltage, may be adjusted. To form MOSFET devices, processes of forming a gate electrode, a source and a drain may be performed.

FIGS. 5 through 8 are cross-sectional views illustrating operations for forming a MOSFET device according to some embodiments of the inventive subject matter.

In more detail, the embodiments of FIGS. 5 through 8 are substantially the same as the embodiments of FIGS. 1 through 4, except that a silicon cap layer 204 is formed above a semiconductor substrate 100. Like reference numerals in FIGS. 5-8 refer to like items.

Figure 5:
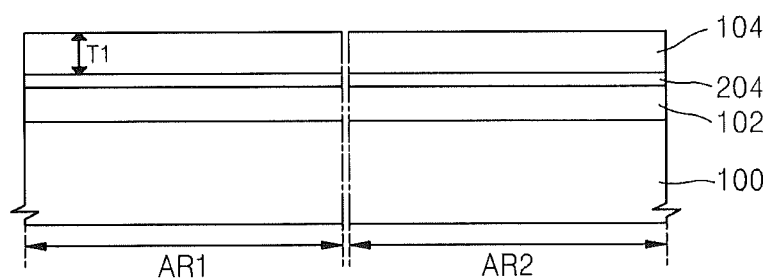
FIGS. 5 through 8 are cross-sectional views illustrating operations for forming a MOSFET device according to some embodiments of the inventive subject matter.

Referring to FIG. 5, a silicon cap layer 204 is formed above the semiconductor substrate 100 having first and second areas AR1 and AR2. The silicon cap layer 204 is formed to prevent a channel or a channel epitaxial layer from being damaged in a subsequent process. An oxide layer 104 having a first thickness T1 is formed on the silicon cap layer 204.

Figure 6:
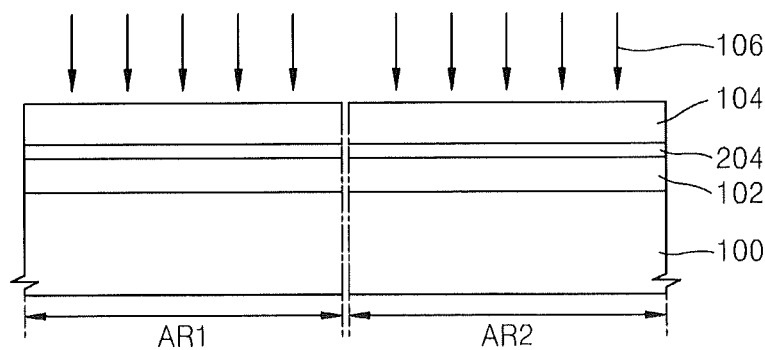
Figure 7:
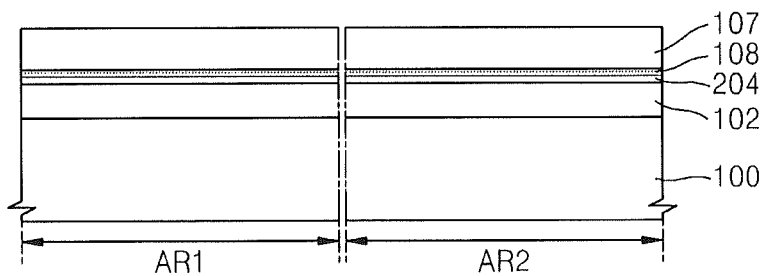

Referring to FIGS. 6 and 7, the oxide layer 104 having the first thickness T1 is nitrified as shown in FIG. 6. Nitrifying may be performed using the same operations as those described above with reference to FIG. 2. As shown in FIG. 7, if nitrifying is performed, a nitrogen injection layer 108 having a substantially uniform density is formed above the semiconductor substrate 100 in the first and second areas AR1 and AR2, and the oxide layer 104 is changed to an oxynitride layer 107 as described with reference to FIG. 3.

If the channel epitaxial layer 102 is formed, the nitrogen injection layer 108 may be formed on the channel epitaxial layer 102 as described above. The nitrogen injection layer 108 may also be formed at an interface between the silicon cap layer 204 or the oxynitride layer 107 and the channel epitaxial layer 102 or at an interface between the oxynitride layer 107 and the semiconductor substrate 100. As described with reference to FIG. 3, the semiconductor substrate 100 above which the oxynitride layer 107 has been formed may be thermally treated.

Figure 8:
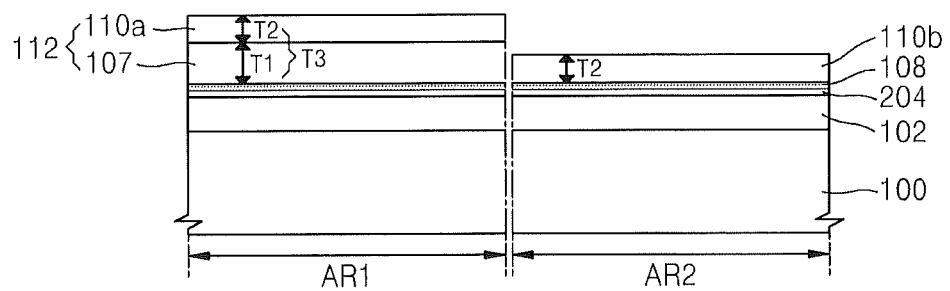

Referring to FIG. 8, a part of the oxynitride layer 107 in the second area AR2 is removed. As described with reference to FIG. 4, insulating layers 110a and 110b having a second thickness T2 are formed on the oxynitride layer 107 in the first area AR1 and on the nitrogen injection layer 108 in the second area AR2. When the insulating layer 110b in the second area AR2 is formed, the channel epitaxial layer 102 may not be damaged due to the nitrogen injection layer 108 and the silicon cap layer 204, and the insulating layers 110a and 110b in the first and second areas AR1 and AR2 may have the same thickness.

As described above, the insulating layers 110a and 110b may have higher dielectric constants than an oxide layer. After the insulating layers 110a and 110b are formed, the semiconductor substrate 100 above which the insulating layers 110a and 110b have been formed may be thermally treated in the manner described above. Therefore, as described above, a first gate insulating layer 112 having a third thickness T3 is formed in the first area AR1, and a second gate insulating layer 110b having a second thickness T2 is formed in the second area AR2.

FIGS. 9 through 12 are cross-sectional views illustrating operations for forming a MOSFET device according to some embodiments of the inventive subject matter.

In more detail, the embodiments of FIGS. 9 through 12 are substantially the same as the embodiments of FIGS. 1 through 4 except that the semiconductor substrate 300 is divided into NMOS and PMOS regions. In FIGS. 9 through 12, the semiconductor substrate 300 is divided into first through fourth areas AR1 through AR4, but one of the first through fourth areas AR1 through AR4 may not be formed.

Referring to FIG. 9, the semiconductor substrate 300 having the first through fourth areas AR1 through AR4 is provided. The semiconductor substrate 300 may be an N type or P type silicon wafer or a silicon substrate.

The first and second areas AR1 and AR2 correspond to the PMOS region, and the third and fourth areas AR3 and AR4 correspond to the NMOS region. A channel epitaxial layer 302 is formed in the PMOS region. The channel epitaxial layer 302 may be formed of SiGe. In the PMOS region, the channel epitaxial layer 302 may assist a device parameter such as a threshold voltage to be optimized and may generate higher carrier mobility. A channel epitaxial layer may not be formed in the NMOS region.

An oxide layer 304 having a first thickness T21 is formed on the semiconductor substrate 300 having the first through fourth areas AR1 through AR4. The first thickness T21 may be within a range between about 40 nm and about 80 nm. In the PMOS region, the oxide layer 304 is formed on the channel epitaxial layer 302.

Referring to FIG. 10, the oxide layer 304 having the first thickness T21 is nitrified. Nitrogen 306 is injected into the oxide layer 304 to achieve nitrifying. Since parts of the oxide layer 304 in the first through fourth areas AR1 through AR4 have the same thicknesses, i.e., the first thicknesses T21, the nitrogen 306 is uniformly injected into a whole surface of the semiconductor substrate 300 in the first through fourth areas AR1 through AR4. Nitrifying may be performed, for example, through nitrogen plasma treatment or thermal treatment in a nitrogen atmosphere. Nitrifying may be performed through nitrogen plasma treatment.

Referring to FIG. 11, if nitrifying is performed as described above, a nitrogen injection layer 308 having a substantially uniform density is formed on the semiconductor substrate 300 in the first through fourth areas AR1 through AR4, and the oxide layer 304 is changed to an oxynitride layer 307. Since the nitrogen injection layer 308 is formed to the uniform density in the first through fourth areas AR1 through AR4 of the semiconductor substrate 300 as described above, the oxynitride layer 307 may be formed to a desired thickness.

The nitrogen injection layer 308 is formed on the channel epitaxial layer 304 in the PMOS region and on the semiconductor substrate 300 in the NMOS region. The nitrogen injection layer 308 may be formed at an interface between the oxynitride layer 307 and the channel epitaxial layer 302 or at an interface between the oxynitride layer 307 and the semiconductor substrate 300.

After the oxide layer 304 is changed to the oxynitride layer 307, the semiconductor substrate 300 above which the oxynitride layer 307 has been formed may be thermally treated. If the semiconductor substrate 300 is thermally treated, the nitrogen injection layer 308 and the oxynitride layer 307 may be more and more activated and densified. The thermal treatment may be performed within 1 hour in a furnace having a temperature between 400° C. and 800° C.

Referring to FIG. 12, parts of the oxynitride layer 307 in the second and fourth areas AR2 and AR4 are removed. Insulating layers 310a, 310b, 310c, and 310d respectively having thicknesses T22 and T25 are formed on the oxynitride layer 307 in the first and third areas AR1 and AR3 and on the nitrogen injection layer 308 in the second and fourth areas AR2 and AR4. Each of the thicknesses T22 and T25 may be 20 nm or less, e.g., may be within a range between 5 nm and 20 nm. The thickness T22 may be equal to or different from the thickness T25.

Due to the nitrogen injection layer 308, the thicknesses T22 and T25 of the insulating layers 310b and 310d in the second area AR2 of the PMOS region and the fourth area AR4 of the NMOS region may be desired thicknesses or equal to each other.

The insulating layers 310a, 310b, 310c, and 310d may be formed of high dielectric layers having higher dielectric constants than an oxide layer. The high dielectric layers may be formed of the same material as that described with reference to FIG. 4 or 8. After the insulating layers 310a, 310b, 310c, and 310d are formed, the semiconductor substrate 300 above which the insulating layers 310a, 310b, 310c, and 310d have been formed may be thermally treated using the same method as that described above.

Accordingly, a first gate insulating layer 312 having a thickness T22 is formed of the oxynitride layer 307 having the thickness T21 and the insulating layer 310a having the thickness T22 in the first area AR1. Also, a second gate insulating layer 310b is formed of the insulating layer 310b having the thickness T22 in the second area AR2. A third gate insulating layer 314 having a thickness T26 is formed of the oxynitride layer 307 having the thickness T24 and the insulating layer 310c having the thickness T25 in the third area AR3, and a fourth gate insulating layer 310d is formed of the insulating layer 310d having the thickness T25 in the fourth area AR4.

In FIG. 12, for convenience, the thickness of the oxynitride layer 307 is denoted by reference character T21 or T24, but a total thickness of the nitrogen injection layer 308 and the oxynitride layer 307 may also be denoted by reference character T21 or T24.

In any case, thicknesses of the first and second gate insulating layers 312 and 310b are different from each other in the first and second areas AR1 and AR2. Thicknesses of the third and fourth gate insulating layers 314 and 310d are different from each other in the third and fourth areas AR3 and AR4.

The first gate insulating layer 312 is formed of a dual layer of the oxynitride layer 307 and the insulating layer 310a in the first area AR1, and the second gate insulating layer 310b is formed of a single layer of the insulating layer 310b in the second area AR2. Also, the third gate insulating layer 314 is formed of a dual layer of the oxynitride layer 307 and the insulating layer 310c in the third area AR3, and the fourth gate insulating layer 310d is formed of a single layer of the insulating layer 310d in the fourth area AR4.

Therefore, thicknesses or materials of the first, second, third, and fourth gate insulating layers 312, 310b, 314, and 310d may be different from one another between the first and second areas AR1 and AR2, between the third and fourth areas AR3 and AR4, and among the first through fourth areas AR1 through AR4. Accordingly, a thickness of an equivalent oxide layer may be easily adjusted through an adjustment of thicknesses of the oxynitride layer 307 and the gate insulating layers 310a through 310d or a change of a material of the insulating layers 310a through 310d between the first and second areas AR1 and AR2, between the third and fourth areas AR3 and AR4, and among the first through fourth areas AR1 through AR4. As a result, a device parameter, e.g., a threshold voltage, may be easily adjusted. To form a MOSFET, a gate electrode, a source, and a drain may be subsequently formed.

FIGS. 13 through 16 are cross-sectional views illustrating operations for forming a MOSFET device according to some embodiments of the inventive subject matter.

In more detail, the current embodiment of FIGS. 13 through 16 is nearly the same as the embodiment of FIGS. 9 through 12 except that a silicon cap layer 404 is formed on a semiconductor substrate 300, and thus the same reference numerals of FIGS. 13 through 16 as those of FIGS. 9 through 12 denote the same elements.

Referring to FIG. 13, the silicon cap layer 404 is formed on a channel epitaxial layer 302 in first and second areas AR1 and AR2 and on the semiconductor substrate 300 in third and fourth areas AR3 and AR4. The silicon cap layer 404 is formed to prevent a channel or the channel epitaxial layer 302 from being damaged in a subsequent process. An oxide layer 304 having a first thickness T21 is formed on the silicon cap layer 404.

Referring to FIG. 14, the oxide layer 304 having the first thickness T21 is nitrified. Nitrogen 306 is injected into the oxide layer 304 to nitrify the oxide layer 304. Nitrifying may be performed using the same method as that described with reference to FIG. 10.

Figure 15:
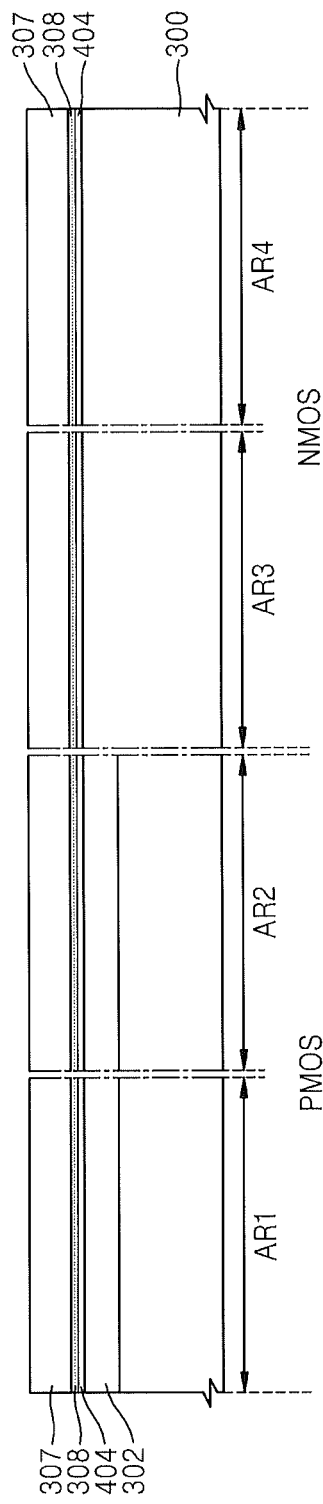

Referring to FIG. 15, if nitrifying is performed as described above, a nitrogen injection layer 308 having a uniform density is formed above the semiconductor substrate 300, and the oxide layer 304 is changed to an oxynitride layer 307 as described with reference to FIG. 11. The nitrogen injection layer 308 is formed on a part of the silicon cap layer 404 formed on the channel epitaxial layer 302 in the PMOS region and on a part of the silicon cap layer 404 formed on the semiconductor substrate 200 in the NMOS region. The nitrogen injection layer 308 may be formed at an interface between the silicon cap layer 404 or the oxynitride layer 307 and the channel epitaxial layer 302 or at an interface between the oxynitride layer 307 and the semiconductor substrate 300.

As described above, the semiconductor substrate 300 above which the oxynitride layer 307 has been formed may be thermally treated.

Figure 16:
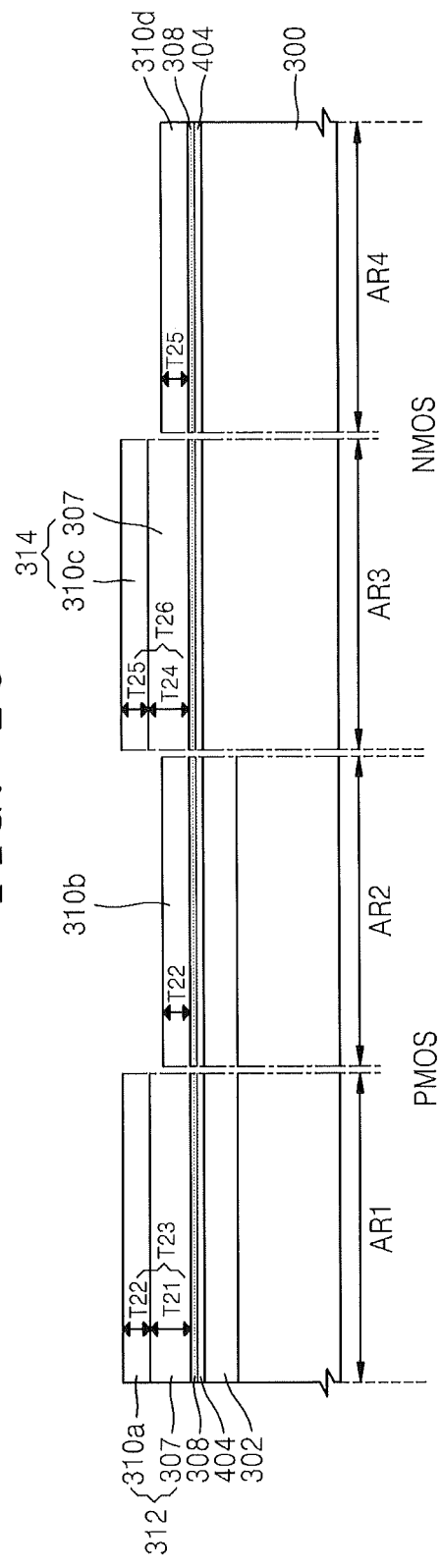

Referring to FIG. 16, parts of the oxynitride layer 307 in the second and fourth areas AR2 and AR4 are removed. As described above, insulating layers 310a, 310b, 310c, and 310d having thicknesses T22 and T25 are formed on the oxynitride layer 307 in the first and third areas AR1 and AR3 and on the nitrogen injection layer 308 in the second and fourth areas AR2 and AR4.

After the insulating layers 310a, 310b, 310c, and 310d are formed, the semiconductor substrate 300 above which the insulating layers 310a, 310b, 310c, and 310d have been formed may be thermally treated using the same method as that described above.

Therefore, a first gate insulating layer 312 having a thickness T23 is formed in the first area AR1, and a second gate insulating layer 310b having a thickness T22 is formed in the second area AR2. Also, a third gate insulating layer 314 having a thickness T26 is formed in the third area AR3, and a fourth gate insulating layer 310d having a thickness T25 is formed in the fourth area AR4. To form MOSFET devices, operations for forming a gate electrode, a source, and a drain may be performed.

Figure 17:
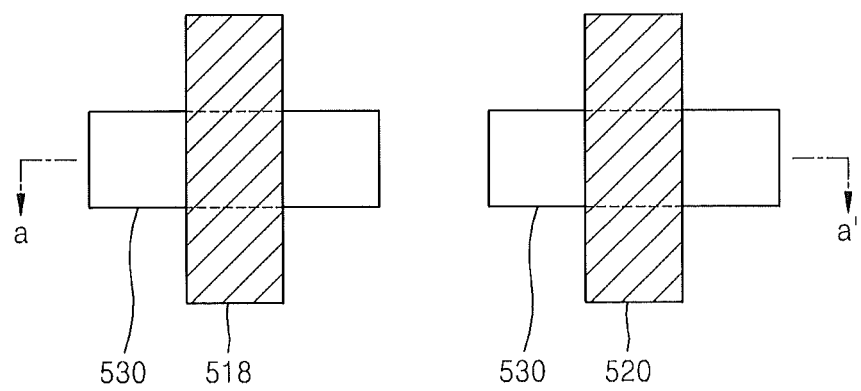
FIGS. 17 and 18 are cross-sectional views illustrating operations for forming a MOSFET device according to some embodiments of the inventive subject matter.
Figure 18:
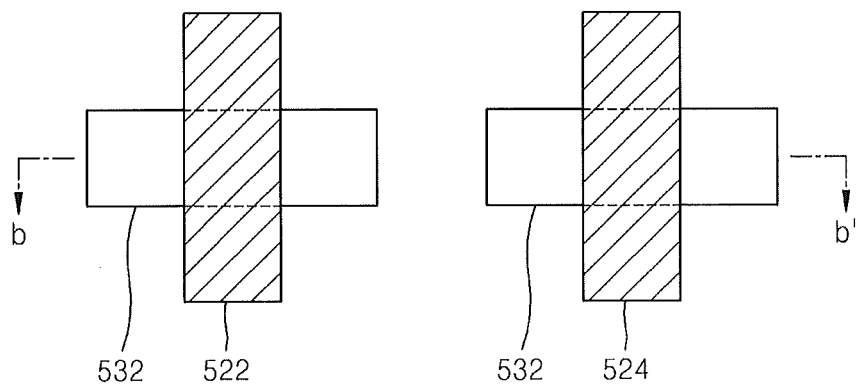

FIGS. 17 and 18 are plan views illustrating operations for forming a MOSFET device according to some embodiments of the inventive subject matter. FIGS. 19 through 22 are cross-sectional views taken along lines a-a' and b-b' of FIGS. 17 and 18.

In more detail, in FIGS. 19 through 22 are cross-sectional views taken along the line a-a' of FIG. 17 illustrating an NMOS region, and cross-sectional views taken along the line b-b' of FIG. 18 illustrating a PMOS region. In FIGS. 19 through 22, gate insulating layers having different thicknesses are formed in the PMOS and NMOS regions, respectively.

Figure 19:
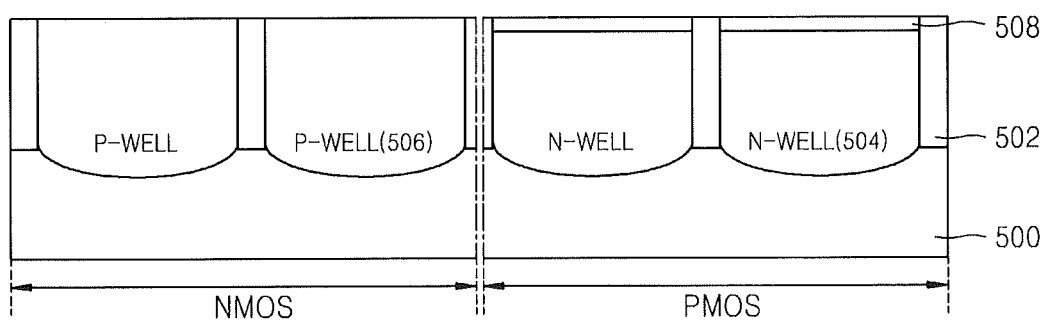
FIGS. 19 through 22 are cross-sectional views taken along lines a-a' and b-b' of FIGS. 17 and 18.

Referring to FIG. 19, a semiconductor substrate 500 having the NMOS and PMOS regions is provided. The semiconductor substrate 500 may be a P type silicon wafer or a silicon substrate. Isolation regions 502 are formed in the semiconductor substrate 500. The isolation regions 502 may be trench isolation regions. P wells 506 are formed in the NMOS region, and N wells 504 are formed in the PMOS region. A channel epitaxial layer 508 is formed on a surface of a part of the semiconductor substrate 500 in the PMOS region. The channel epitaxial layer 508 may be formed of SiGe.

Figure 20:
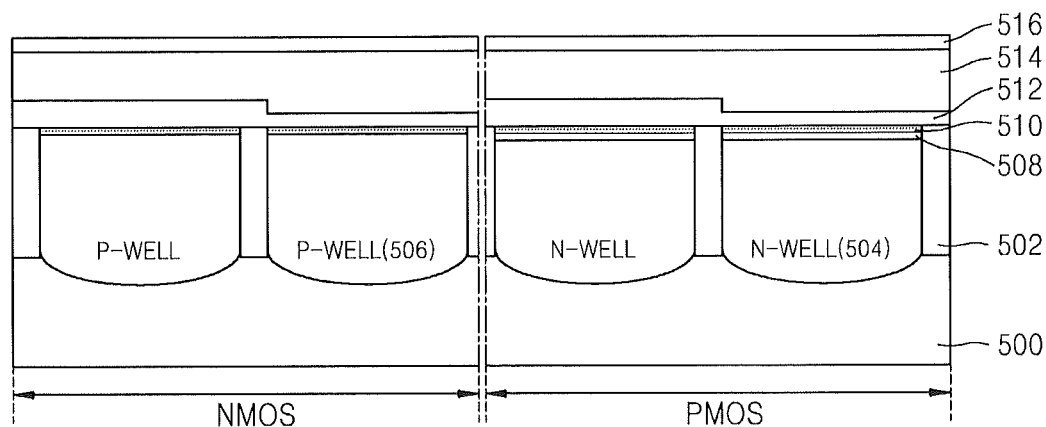

Referring to FIG. 20, a nitrogen injection layer 510 having a uniform density is formed on the semiconductor substrate 500 having the NMOS and PMOS regions as described in the previous embodiments. In the PMOS region, the nitrogen injection layer 510 is formed on the channel epitaxial layer 508. A gate insulating material layer 512 having different thicknesses is formed on the nitrogen injection layer 510 according to the previous embodiments.

A gate electrode conductive layer 514 and a gate cap layer insulating layer 516 are formed on the gate insulating material layer 512. The gate electrode conductive layer 514 may include a metal layer or a compound layer of a metal layer and a polysilicon layer.

Figure 21:
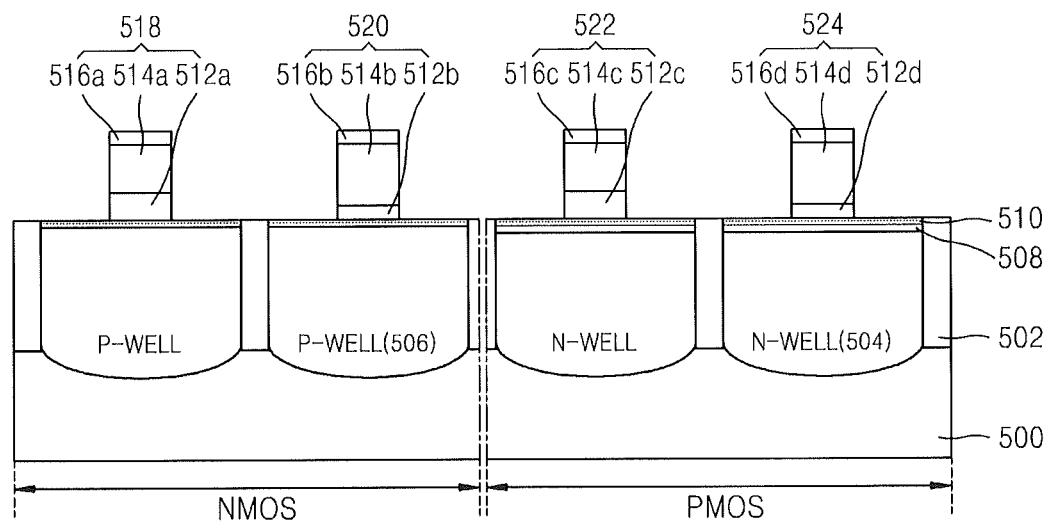

Referring to FIG. 21, the gate cap layer insulating layer 516, the gate electrode conductive layer 514, and the gate insulating material layer 512 are patterned, thereby forming first, second, third, and fourth gate patterns 518, 520, 522, and 524. The first, second, third, and fourth gate patterns 518, 520, 522, and 524 respectively include gate insulating layers 512a through 512d, gate electrodes 514a through 514d, and gate cap layers 516a through 516d. The first, second, third and fourth gate patterns 518, 520, 522, and 524 may be gate lines.

The first gate insulating layer 512a of the first gate pattern 518 has a different thickness than the second gate insulating layer 512b of the second gate pattern 520, and the third gate insulating layer 512c of the third gate pattern 522 has a different thickness than the fourth gate insulating layer 512d of the fourth gate patter 524.

The nitrogen injection layer 510 may be formed on the semiconductor substrate 500 or the channel epitaxial layer 508 in the PMOS region, but is formed on the semiconductor substrate 500 in the NMOS region.

Figure 22:
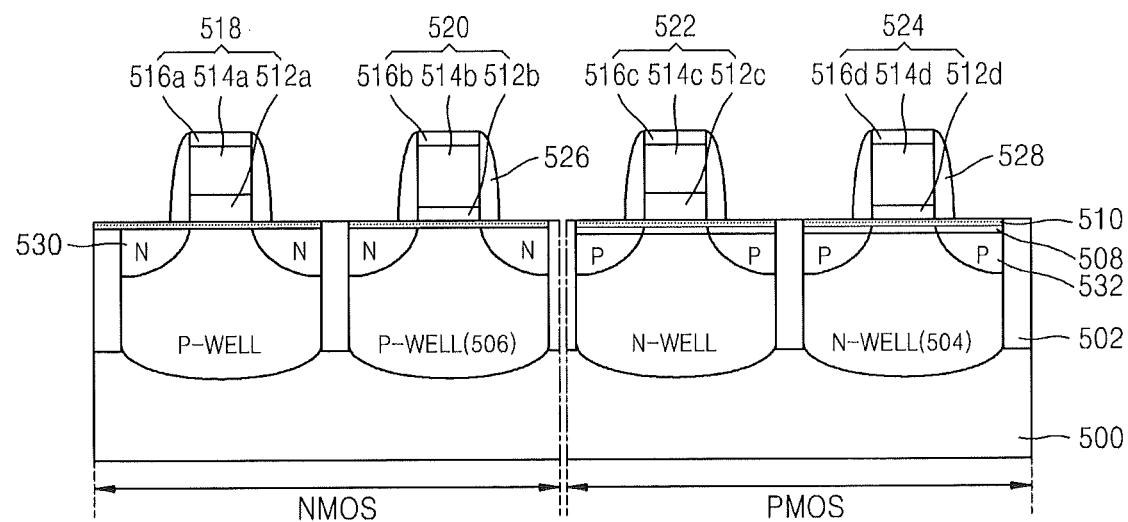

Referring to FIG. 22, spacers 526 and 528 are formed on sidewalls of each of the first, second, third, and fourth gate patterns 518, 520, 522, and 524 in the NMOS and PMOS regions. Impurities are injected into a surface of the semiconductor substrate 500 in which the P wells 506 have been formed, using the spacers 526 as masks, thereby forming N type sources/drains 530 of N type impurity areas. Impurities are injected into a surface of the semiconductor substrate 500 in which the N wells 504 have been formed, using the spacers 528 as masks, thereby forming P type sources/drains 532 of P type impurity areas. The N type sources/drains 530 and the P type sources/drains 532 of FIG. 22 may include lightly doped drain (LDD) areas. A MOSFET device may be formed through the above-described processes.

Figure 23:
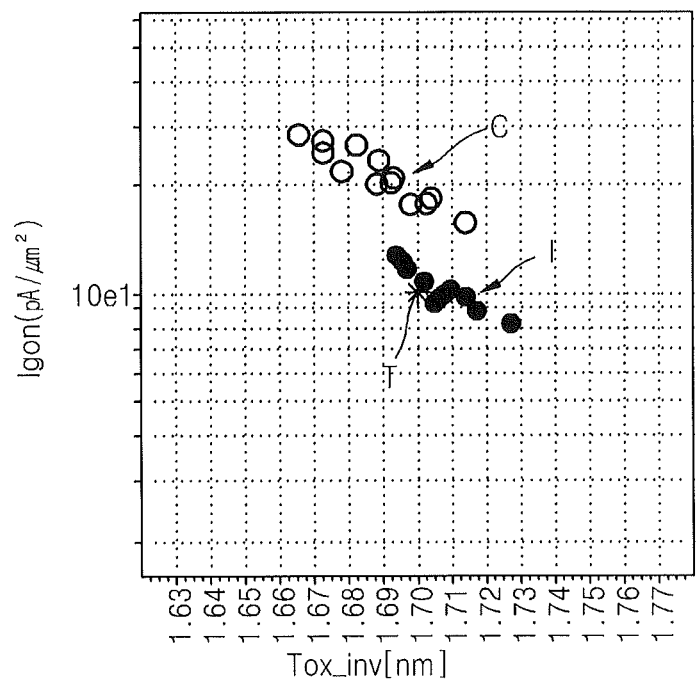
FIGS. 23 and 24 are views illustrating an on-current characteristic of a MOSFET device according to some embodiments of the inventive subject matter.
Figure 24:
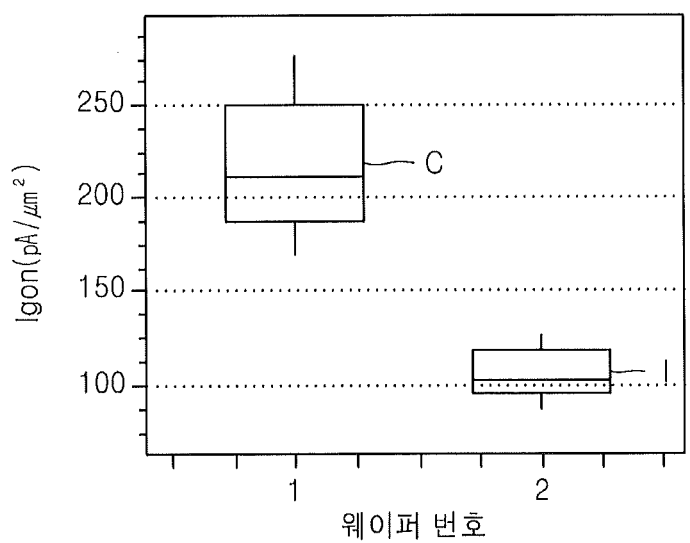

FIGS. 23 and 24 are views illustrating an on-current characteristic of a MOSFET device according to some embodiments of the inventive subject matter.

In more detail, FIG. 23 illustrates a distribution of a gate on current Igon with respect to an a thickness Tox_inv of an inversion layer of gate insulating layers in a PMOS MOSFET device including gate insulating layers having different thicknesses. FIG. 24 illustrates a distribution of a gate on current Igon of a PMOS MOSFET device including gate insulating layers having different thicknesses. The gate on current Igon indicates a current that leaks toward a gate when a channel is in an on state. In FIGS. 23 and 24, reference character I denotes a PMOS MOSFET device according to some embodiments of the inventive subject matter. Reference character C denotes a conventional PMOS MOSFET device in which a nitrogen injection layer is not uniformly injected into a semiconductor substrate. Reference character T denotes an on-current target value depending on the inversion layer.

As shown in FIG. 23, a gate on current value of the PMOS MOSFET device I including gate insulating layers having different thicknesses according to the inventive subject matter approaches the on current target value T of the inversion layer. Also, the gate on current value of the PMOS MOSFET device I is lower than a gate on current value of the PMOS MOSFET device C as shown from the thickness of the inversion layer. As shown in FIG. 24, the value and distribution of the gate on current Igon of the PMOS MOSFET device I including the gate insulating layers having the different thicknesses are lower than those of the gate on current Igon of the conventional PMOS MOSFET device C.

Figure 25:
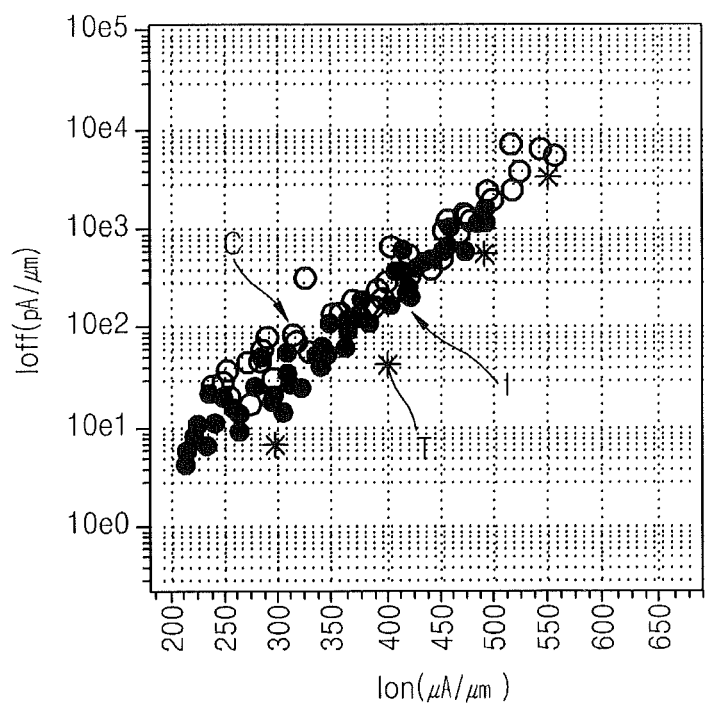
FIGS. 25 and 26 are views illustrating a performance characteristic of the MOSFET device according to some embodiments of the inventive subject matter.
Figure 26:
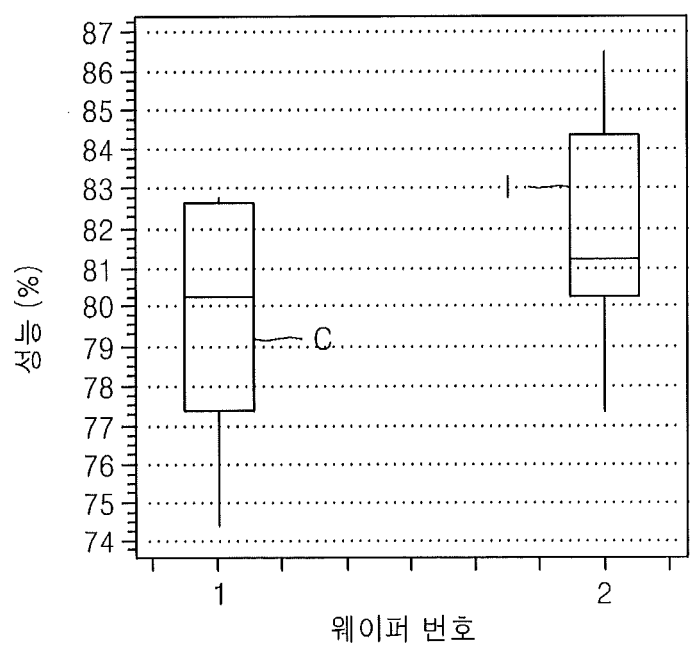

FIGS. 25 and 26 are views illustrating a performance characteristic of a MOSFET device according to some embodiments of the inventive subject matter.

In more detail, FIG. 25 illustrates a relationship between an on current Ion and an off current Ioff in a PMOS MOSFET device including gate insulating layers having different thicknesses. FIG. 26 illustrates a ratio between the on current Ion and the off current Ioff of the PMOS MOSFET device including the gate insulating layers having the different thicknesses.

In FIGS. 25 and 26, reference character I denotes a PMOS MOSFET device according to some embodiments of the inventive subject matter. Reference character C denotes a conventional PMOS MOSFET device in which a nitrogen injection layer is not uniformly formed on a semiconductor substrate. Reference character T denotes an off current target value with respect to the on current.

As shown in FIG. 25, in the PMOS MOSFET device I of the inventive subject matter, the relationship between the on current Ion and the off current Ioff approaches a target value. At a particular off current value, an on current value of the PMOS MOSFET device I is higher than that of the conventional PMOS MOSFET device C. As shown in FIG. 26, the performance of the PMOS MOSFET device I of the inventive subject matter may be better than that of the conventional PMOS MOSFET device C.

Figure 27:
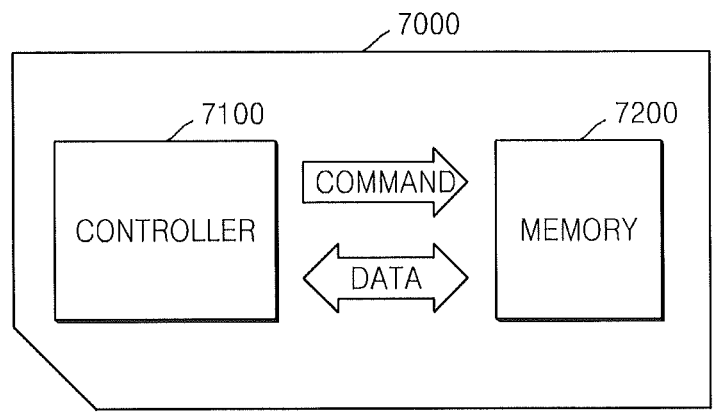
FIG. 27 is a schematic block diagram of a memory card including a MOSFET device according to some embodiments of the inventive subject matter.

FIG. 27 is a schematic block diagram of a memory card 7000 including a MOSFET device according to some embodiments of the inventive subject matter.

Referring to FIG. 27, in the memory card 7000, a controller 7100 and a memory 7200 are disposed to exchange an electric signal with each other. For example, when the controller 7100 transmits a command to the memory 7200, the memory 7200 transmits data to the controller 7100. The controller 7100 and/or the memory 7200 may include a MOSFET device according to one of the embodiments of the inventive subject matter. The memory 7200 may include a memory array (not shown) or a memory array bank (not shown).

The memory card 7000 may be used in various types of cards, e.g., memory devices such as a memory stick card, a smart media (SM) card, a secure digital (SD) card, a mini secure digital (mini SD) card, or a multimedia card (MMC).

Figure 28:
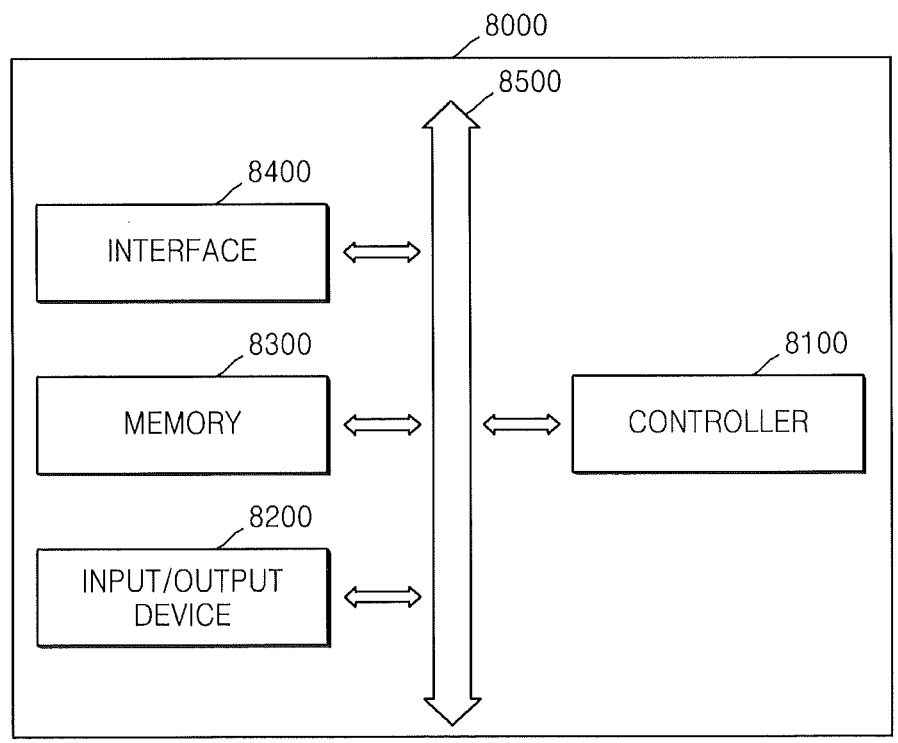
FIG. 28 is a schematic block diagram of an electronic system including a MOSFET device according to some embodiments of the inventive subject matter.

FIG. 28 is a schematic block diagram of an electronic system 8000 including a MOSFET device according to some embodiments of the inventive subject matter.

Referring to FIG. 28, the electronic system 8000 includes a controller 8100, an input/output (I/O) unit 8200, a memory 8300, and an interface 8400. The electronic system 8000 may be a mobile system or a system which transmits or receives information. The mobile system may be a personal digital assistant (PDA), a portable computer, a wet tablet, a wireless phone, a mobile phone, a digital music player, or a memory card.

The controller 8100 may execute a program and control the electronic system 8000. For example, the controller 8100 may be a microprocessor, a digital signal processor, a microcontroller, or a device similar to them. The I/O unit 8200 may be used to input data into the electronic system 8000 or output data from the electronic system 8000.

The electronic system 8000 is connected to an external device, e.g., a personal computer or a network, using the I/O unit 8200 to exchange data with the external device. The I/O unit 8200 may be a keypad, a keyboard, or a display. The memory 8300 stores codes and/or data for an operation of the controller 8100 and/or stores data that has been processed by the controller 8100. The controller 8100 and/or the memory 8300 may include a MOSFET device according to any one of the embodiments of the inventive subject matter. The interface 8400 may be a transmission path through which the electronic system 8000 transmits data to the external device. The controller 8100, the I/O unit 8200, the memory 8300, and the interface 8400 communicate with one another through a bus 8500.

For example, the electronic system 8000 may be used in a mobile phone, an MP3 player, a navigation system, a portable multimedia player (PMP), a solid state disk (SSD), or household appliances.

As described above, according to the inventive subject matter, a nitrogen injection layer may be formed to a uniform density in first and second areas of a semiconductor substrate, thereby forming gate insulating layers to desired different thicknesses. If a channel epitaxial layer is formed in the first or second area, the channel epitaxial layer may not be damaged due to the nitrogen injection layer or a silicon cap layer when an insulating layer is formed in the second area.

While the inventive subject matter has been particularly shown and described with reference to exemplary embodiments thereof, it will be understood that various changes in form and details may be made therein without departing from the spirit and scope of the following claims.

What is claimed is:

1. A method comprising:
    forming a channel epitaxial layer on a semiconductor substrate;
    forming a silicon cap layer on the channel epitaxial layer;
    forming an oxide layer on the silicon cap layer;
    injecting nitrogen into the oxide layer to form a nitrogen injection layer in the silicon cap layer and to change the oxide layer to an oxynitride layer;
    removing a part of the oxynitride layer to leave a portion of the oxynitride layer in a first area and expose the nitrogen injection layer in a second area; and
    forming an insulating layer comprising a portion on the portion of the oxynitride layer in the first area and a portion on the nitrogen injection layer in the second area.

2. The method of claim 1, wherein injecting nitrogen into the oxide layer to form a nitrogen injection layer and to change the oxide layer to an oxynitride layer comprises nitrifying a portion of the oxide layer.

3. The method of claim 1, wherein the channel epitaxial layer comprises silicon-germanium (SiGe).

4. The method of claim 1, wherein injecting nitrogen into the oxide layer to form a nitrogen injection layer and to change the oxide layer to an oxynitride layer is followed by thermally treating the semiconductor substrate.

5. The method of claim 1, wherein forming an insulating layer is followed by thermally treating the semiconductor substrate.

6. The method of claim 1, wherein the insulating layer has a higher dielectric constant than the oxide layer.

7. The method of claim 1, further comprising forming a first gate electrode on a first gate insulating layer comprising the insulating layer and the portion of the oxynitride layer in the first area and a second gate electrode on a second gate insulating layer comprising the insulating layer in the second area, such that the first and second gate insulating layers have different thicknesses.

8. The method of claim 7, further comprising forming source and drain regions in the substrate adjacent the gate electrodes.

9. A method comprising:
    forming first and second P-type regions and first and second N-type regions in a semiconductor substrate;
    forming channel epitaxial layers on the first and second N-type regions;
    forming an oxide layer on the first and second P-type regions and on the channel epitaxial regions;
    injecting nitrogen into the oxide layer to form a nitrogen injection layer on the first and second P-type regions and the channel epitaxial layers and to convert the oxide layer to an oxynitride layer;
    removing portions of the oxynitride layer to expose the nitrogen injection layer on the second P-type region and the second N-type region and leave portions of the oxynitride layer on the first P-type region and the first N-type region; and
    forming an insulating layer on the portions of the oxynitride layer on the first N-type region and the first P-type region and on the exposed nitrogen injection layer on the second N-type region and the second P-type region.

10. The method of claim 9, wherein injecting nitrogen into the oxide layer to form a nitrogen injection layer on the first and second P-type regions and the first and channel epitaxial layers and to convert the oxide layer to an oxynitride layer comprises treating the oxide layer using a nitrogen plasma or thermally treating the oxide layer in a nitrogen atmosphere.

11. The method of claim 9, wherein forming channel epitaxial layers on the first and second N-type regions is followed by forming silicon cap layers on the channel epitaxial layers and wherein injecting nitrogen into the oxide layer to form a nitrogen injection layer on the first and second P-type regions and the channel epitaxial layers and to convert the oxide layer to an oxynitride layer comprises forming the nitrogen injection layer on the silicon cap layers.

12. The method of claim 9, further comprising forming respective first, second, third and fourth gate electrodes on respective ones of the first and second N-type regions and the first and second P-type regions.

13. The method of claim 12, further comprising forming source and drain regions in the substrate adjacent the first, second, third and fourth gate electrodes.

* * * * *